US012719035B2

United States Patent

(12) United States Patent
Shinagawa et al.

(10) Patent No.: US 12,719,035 B2
(45) Date of Patent: Aug. 25, 2026

(54) PROFILE SIMULATION CALIBRATION WITH IN-SITU SENSOR DATA

(71) Applicant: Tokyo Electron Limited, Tokyo (JP)

(72) Inventors: Jun Shinagawa, Fremont, CA (US); Inga Kuznetsova, Fremont, CA (US); Shyam Sridhar, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 358 days.

(21) Appl. No.: 18/583,440

(22) Filed: Feb. 21, 2024

(65) Prior Publication Data

US 2025/0266250 A1 Aug. 21, 2025

(51) Int. Cl.

| | |
|---|---|
| ***H01J 37/32*** | (2006.01) |
| ***G05B 19/048*** | (2006.01) |
| ***H10P 74/20*** | (2026.01) |

(52) U.S. Cl.

CPC ...... *H01J 37/32972* (2013.01); *G05B 19/048* (2013.01); *H10P 74/203* (2026.01); *G05B 2219/45031* (2013.01)

(58) Field of Classification Search

CPC .......... H01J 37/32972; H01J 37/32935; H10P 74/23; H10P 74/203; G05B 19/048; G05B 2219/45031; G05B 13/048; G05B 19/41885

See application file for complete search history.

(56) References Cited

U.S. PATENT DOCUMENTS

| | | | |
|---|---|---|---|
| RE39,534 E | 3/2007 | Cooperberg et al. | |
| 10,386,828 B2 | 8/2019 | Tetiker et al. | |
| 10,572,697 B2 | 2/2020 | Feng et al. | |
| 2017/0176983 A1 | 6/2017 | Tetiker et al. | |
| 2021/0157228 A1* | 5/2021 | Sriraman | G03F 1/70 |
| 2022/0035979 A1 | 2/2022 | Moffatt et al. | |
| 2024/0332092 A1* | 10/2024 | Huang | G05B 13/0265 |

* cited by examiner

*Primary Examiner* — Bao Long T Nguyen

(74) *Attorney, Agent, or Firm* — Oblon, McClelland, Maier & Neustadt, L.L.P.

(57) ABSTRACT

A method of profile simulator calibration is provided. The method includes executing a plasma recipe on a wafer in a processing chamber. In-situ plasma sensor data are collected by in-situ plasma sensors while the plasma recipe is executed. Estimated plasma parameters are obtained based on the in-situ plasma sensor data. A predicted profile of the wafer is obtained by inputting the estimated plasma parameters into a profile simulator. A measured profile of the wafer is obtained using wafer metrology after executing the plasma recipe. The profile simulator is calibrated by comparing the predicted profile with the measured profile.

20 Claims, 10 Drawing Sheets

PROFILE SIMULATION CALIBRATION WITH IN-SITU SENSOR DATA

INCORPORATION BY REFERENCE

Aspects of the present disclosure are related to U.S. Pat. No. 11,869,756, which is incorporated herein by reference in its entirety.

FIELD OF THE INVENTION

This disclosure relates generally to semiconductor fabrication and more particularly to the calibration of data simulations.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Particularly, plasma processing plays a vital role in material deposition and removal in the production of semiconductor chips. Typical examples include plasma-assisted chemical vapor deposition, plasma-assisted physical vapor deposition, plasma etching, plasma cleaning, etc.

SUMMARY

The present disclosure relates to a method of profile simulator calibration and an apparatus for executing the same.

According to a first aspect of the disclosure, a method of profile simulator calibration is provided. The method includes executing a plasma recipe on a wafer in a processing chamber. In-situ plasma sensor data are collected by in-situ plasma sensors while the plasma recipe is executed. Estimated plasma parameters are obtained based on the in-situ plasma sensor data. A predicted profile of the wafer is obtained by inputting the estimated plasma parameters into a profile simulator. A measured profile of the wafer is obtained using wafer metrology after executing the plasma recipe. The profile simulator is calibrated by comparing the predicted profile with the measured profile.

In some embodiments, in-situ wafer data are collected by in-situ wafer metrology in the processing chamber. Estimated wafer properties are obtained by inputting the in-situ wafer data into a virtual metrology (VM) model.

In some embodiments, both the estimated plasma parameters and the estimated wafer properties are input into the profile simulator to obtain the predicted profile.

In some embodiments, the in-situ wafer metrology includes an in-situ reflectometer. The in-situ wafer data include reflectometry spectra.

In some embodiments, the estimated wafer properties include temperature and refractive indices of the wafer obtained from the VM model.

In some embodiments, the estimated wafer properties further include a sticking coefficient based on the temperature and refractive indices of the wafer.

In some embodiments, the in-situ wafer data are collected immediately before, immediately after, or both immediately before and immediately after, the plasma recipe is executed.

In some embodiments, the in-situ plasma sensors are not invasive to a plasma generated by executing the plasma recipe in the processing chamber.

In some embodiments, the in-situ plasma sensors do not directly measure plasma properties of the plasma.

In some embodiments, the in-situ plasma sensors include at least one sensor selected from the group consisting of an optical emission spectrometer (OES), a radio frequency (RF) sensor and a mass spectrometer (MS).

In some embodiments, the in-situ plasma sensors include an OES. The in-situ plasma sensor data include OES data. Obtaining the estimated plasma parameters includes estimating an etchant density based on the OES data and actinometry.

In some embodiments, the in-situ plasma sensors include an RF sensor. The in-situ plasma sensor data include voltage and current (V-I) data. Obtaining the estimated plasma parameters includes estimating an ion flux or ion energy based on the V-I data and a calibration against electron density measurement.

In some embodiments, the in-situ plasma sensors include an MS. The in-situ plasma sensor data include MS data. Obtaining the estimated plasma parameters includes estimating a deposition rate based on the MS data.

In some embodiments, the profile simulator includes one or more graphical models configured to generate a cross-sectional profile of the wafer.

In some embodiments, calibrating the profile simulator includes adjusting at least one selected from the group consisting of a graphical model coefficient and a graphical model, based on a difference between the predicted profile and the measured profile.

In some embodiments, the plasma recipe is adjusted. The plasma recipe is re-executed. A re-predicted profile is obtained using the profile simulator calibrated. A re-measured profile is obtained using the wafer metrology. The re-predicted profile is compared with the re-measured profile.

In some embodiments, an initial profile of the wafer is obtained using the wafer metrology before the plasma recipe is executed. The initial profile of the wafer and the estimated plasma parameters are input into the profile simulator to obtain the predicted profile.

In some embodiments, the wafer metrology includes at least one selected from the group consisting of scanning electron microscopy (SEM) and transmission electron microscopy (TEM).

In some embodiments, the plasma recipe includes a plasma etching recipe.

According to a second aspect of the disclosure, an apparatus is provided. The apparatus includes a controller including a processor that is programmed to execute a plasma recipe on a wafer in a processing chamber. In-situ plasma sensor data are collected by in-situ plasma sensors while the plasma recipe is executed. Estimated plasma parameters are obtained based on the in-situ plasma sensor data. A predicted profile of the wafer is obtained by inputting the estimated plasma parameters into a profile simulator. A measured profile of the wafer is obtained using wafer metrology after executing the plasma recipe. The profile simulator is calibrated by comparing the predicted profile with the measured profile.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
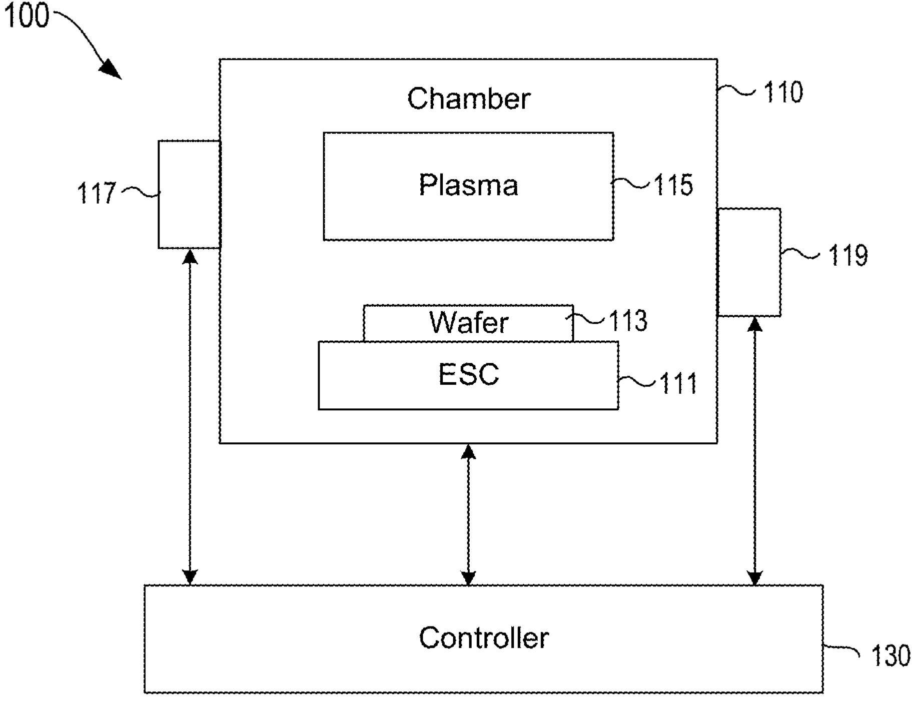
FIG. 1 shows a schematic of a plasma system in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

As noted in the Background, plasma processing plays a vital role in semiconductor manufacturing. After a given plasma process, a profile simulator can be used to simulate a cross-sectional profile of a wafer. A large number of unknown profile simulator input parameters are often calibrated by minimizing errors between cross-sectional profile measurement and simulated profile values, which requires a large number of training data sets. Another approach to calibrate a profile simulator is to measure plasma parameters such as electron density by running probe measurements, but the probe measurements are not suited for a process development environment because they are invasive and time-consuming. Additionally, for tight profile specification control for advance nodes, plasma variations caused by chamber condition variations (e.g. wall surface, consumables, etc.) need to be monitored as these variations can have significant impacts on feature profile variations.

U.S. Pat. No. RE39,534 E discloses a method and an apparatus to calibrate a semi-empirical process simulator. Unknown surface parameters are calibrated by using a test model and deriving test conditions. However, calibration is done with actual cross-sectional profile measurements as well as etch and deposition rates. Reaction parameters are obtained by measurements or by reactor models whereas no surface parameters are provided. US Patent No. 2017/0176983 A1 discloses a method and an apparatus for etch profile matching by surface kinetic model optimization. Model parameters are optimized using "metrics" calculated from cross-sectional profile measurements and theoretical values. U.S. Pat. No. 10,572,697 B2 is directed to a method of etch model calibration using optical scatterometry, with no plasma measurement however. Process parameter values are instead predicted. The cost function is based on the target features of reflectance spectra instead of cross-sectional profile measurements such as scanning electron microscopy (SEM) and transmission electron microscopy (TEM). None of these references utilizes in-situ plasma sensor data and/or in-situ wafer metrology sensor data.

In Applicant's U.S. Pat. No. 11,869,756, which is incorporated herein by reference in its entirety, chamber conditions can be described by plasma parameters which are directly measured by in-situ sensors for a plasma chamber.

Therefore, chamber conditions can be integrated into a VM model that is used to perform some prediction and generate an etch profile. As a result, the VM model is robust against chamber condition variations. Nevertheless, direct measurement of plasma parameters can be invasive to the plasma environment and time-consuming as well.

Techniques herein provide a method to calibrate a profile simulator by using estimated plasma parameters and wafer properties using in-situ plasma and wafer metrology sensors. Particularly, in-situ plasma and metrology sensors are utilized to replace traditional invasive probe measurements to enable fast and non-invasive measurements while simultaneously monitoring chamber condition variations. As a result, this methodology enables high-fidelity calibration of the profile simulator by reducing the number of unknown input coefficients and also reducing errors by tracking plasma variations due to chamber condition variations. Moreover, techniques herein provide a highly accurate and adaptable profile simulator that can be readily deployable to various process development environments.

FIG. 1 shows a schematic of a plasma system (referred to as a system 100 hereinafter) in accordance with one embodiment of the present disclosure. As shown, the system 100 can include at least one plasma processing chamber (referred to as a chamber 110 hereinafter). In the chamber 110, a wafer 113 can be placed on an electrostatic chuck (ESC) 111 and characterized by one or more in-situ wafer metrology sensors 117. A plasma 115 can be generated and characterized by one or more in-situ plasma sensors 119. The plasma 115 can be utilized for various purposes, such as etching, film deposition, cleaning, surface activation and modification, etc. Plasma etching will be described in this disclosure for illustrative purposes and is not limiting.

Note that the in-situ plasma sensors 119 can be placed and configured to be non-invasive to the plasma 115 and/or the wafer 113. The in-situ plasma sensors 119 need not directly measure plasma properties of the plasma 115 but may instead provide measurements that can be used to estimate plasma properties, which will be further explained in FIG. 2A. The in-situ plasma sensors 119 can include an optical emission spectroscopy (OES) sensor, a radio frequency (RF) sensor, a mass spectrometer (MS), an ion flux sensor, a temperature sensor, a pressure sensor, and/or other plasma sensors as known by one skilled in the art. For example, the in-situ plasma sensors 119 can preferably include an OES, an RF sensor and an MS.

Similarly, in-situ wafer metrology sensors 117 can be placed and configured to be non-invasive to the plasma 115 and/or the wafer 113. The in-situ wafer metrology sensors 117 need not directly measure a cross-sectional profile of the wafer 113 but may instead provide measurements that can be used to help estimate the cross-sectional profile, which will be further explained in FIG. 2A. The in-situ wafer metrology sensors 117 can include a reflectometer (RM), an ellipsometer, other non-invasive optical metrology and/or other wafer metrology sensors as known by one skilled in the art. For example, the in-situ wafer metrology sensors 117 can preferably include a reflectometer.

Locations of the in-situ wafer metrology sensors 117 and the in-situ plasma sensors 119 are not particularly limited. That is, the in-situ wafer metrology sensors 117 and the in-situ plasma sensors 119 can be placed inside or outside the chamber 110, in contact with, in proximity to, distant from or within the wafer 113, and the like. Preferably, the in-situ wafer metrology sensors 117 and the in-situ plasma sensors 119 may be placed in proximity to or distant from the plasma 115 in order to minimize interference with the plasma 115.

In one embodiment, the wafer 113 is a dummy wafer or a test wafer. Accordingly, the wafer 113 can include one or more blanket films formed thereon. In another embodiment, the wafer 113 is a product wafer having patterned structure manufactured thereon.

Further, a controller 130 may optionally be included in the example of FIG. 1. Components of one or more corresponding plasma tools can be connected to and controlled by the controller 130 that may optionally be connected to a corresponding memory storage unit and user interface (all not shown). Various plasma-processing operations can be executed via the user interface, and various plasma processing recipes and operations can be stored in a storage unit. Accordingly, the wafer 113 can be processed within the chamber 110 with various microfabrication techniques.

The controller 130 may be coupled to various components of the corresponding plasma tool(s) to receive inputs from and provide outputs to the components. For example, the controller 130 can be configured to receive in-situ sensor data from the in-situ wafer metrology sensors 117 and/or the in-situ plasma sensors 119. The controller 130 can also be configured to adjust knobs and control settings for the corresponding plasma tool(s), or more specifically the chamber 110. Of course the adjustment(s) can be manually made as well.

The controller 130 can be implemented in a wide variety of manners. In one example, the controller 130 is a computer. In another example, the controller 130 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 2A:
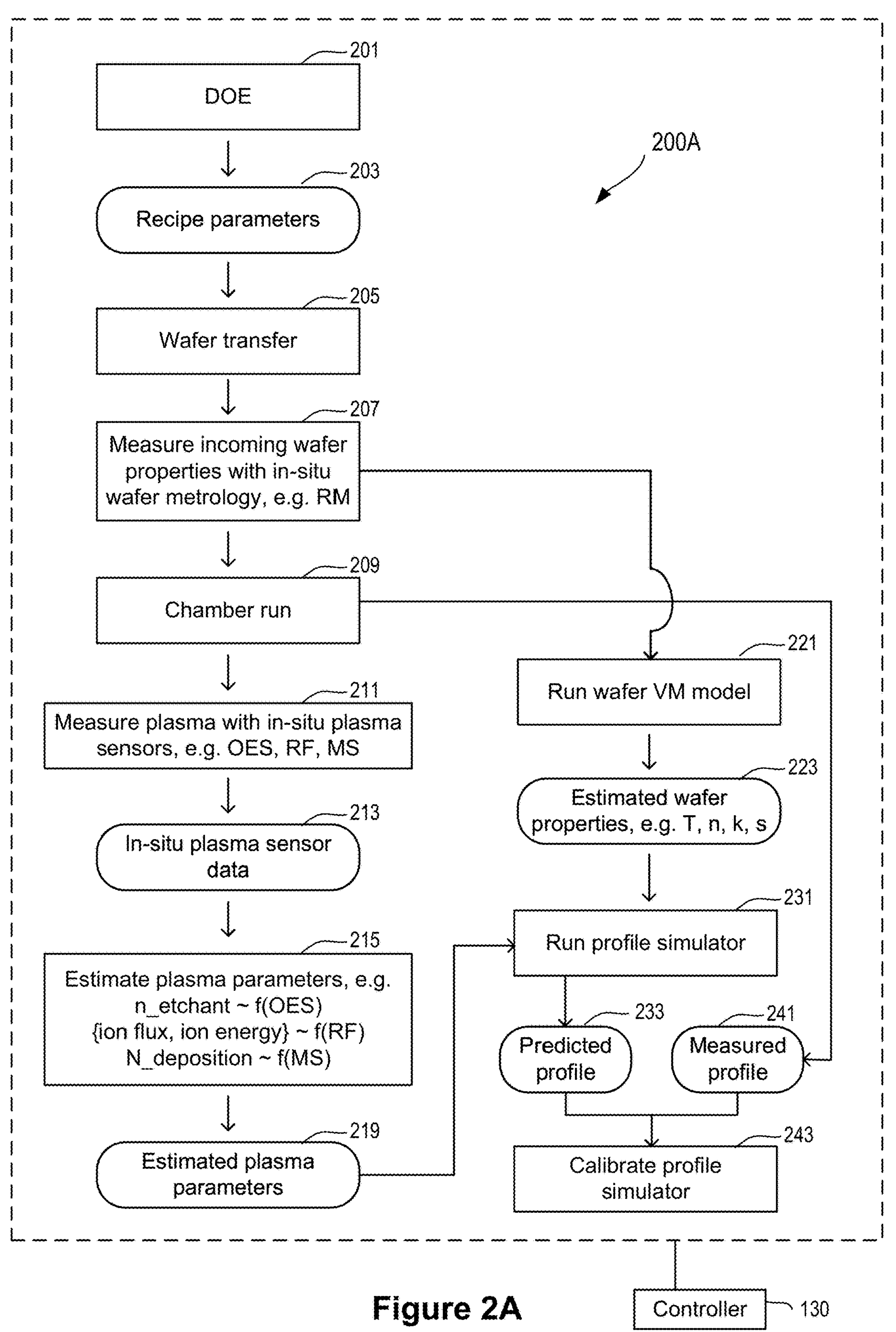
FIG. 2A shows a flow diagram of profile simulator calibration in accordance with one embodiment of the present disclosure.

FIG. 2A shows a flow diagram of a process 200A of profile simulator calibration in accordance with one embodiment of the present disclosure. For illustrative purposes, the in-situ plasma sensors 119 include an OES, an RF sensor and an MS while the in-situ wafer metrology sensors 117 include a reflectometer. The OES, the RF sensor and the MS are preferably placed outside the chamber 110 while the reflectometer is preferably placed inside the chamber 110.

In block 201, design of experiment (DOE) is executed to select or obtain recipe parameters 203. In block 205, the wafer 113 is transferred to or loaded in the chamber 110.

In block 207, incoming wafer properties are measured with the in-situ wafer metrology sensors 117. For example, reflectometry spectra of the wafer 113 can be obtained by the aforementioned reflectometer. In block 221, the reflectometry spectra can be input into a wafer VM model to output estimated wafer properties 223 such as wafer temperature (T), wafer refractive indices (n and k) and the like. A sticking coefficient ($s_0$) can further be estimated based on $s_0=s_{00}(T)\exp(-\varepsilon_{ads}/T)$, where $\varepsilon_{ads}$ is an adsorption energy, and $s_{00}$ is a baseline sticking coefficient. The sticking coefficient ($s_0$) depends on temperature, crystal orientation and surface roughness.

In block 209, a plasma recipe such as a plasma etching recipe is executed in the chamber 110. The plasma 115 can be probed by the in-situ plasma sensors 119, while the plasma recipe is being executed, to obtain in-situ plasma sensor data 213, including OES data, voltage and current (V-I) data and MS data. In block 215, estimated plasma parameters 219 can be obtained based on the in-situ plasma sensor data 213, for example using plasma diagnostic techniques and calibration models such as knowledge and models already known by one skilled in the art.

In some embodiments, a deposition rate $N_{deposition}$ can be estimated based on the MS data. An etchant density $n_{etchant}$ can be estimated based on the OES data and actinometry which enables species density measurement independent of optical environments. For instance, $n_n=Kn_{Ar}I_n/I_{Ar}$, where $n_n$ is a neutral density, $n_{Ar}$ is an argon density, $I_n$ is an OES intensity of a neutral species, $I_{Ar}$ is an OES intensity of argon, and K is a constant. Additionally, an ion flux and/or an ion energy can be estimated based on the V-I data and a calibration against electron density measurement.

Figure 3:
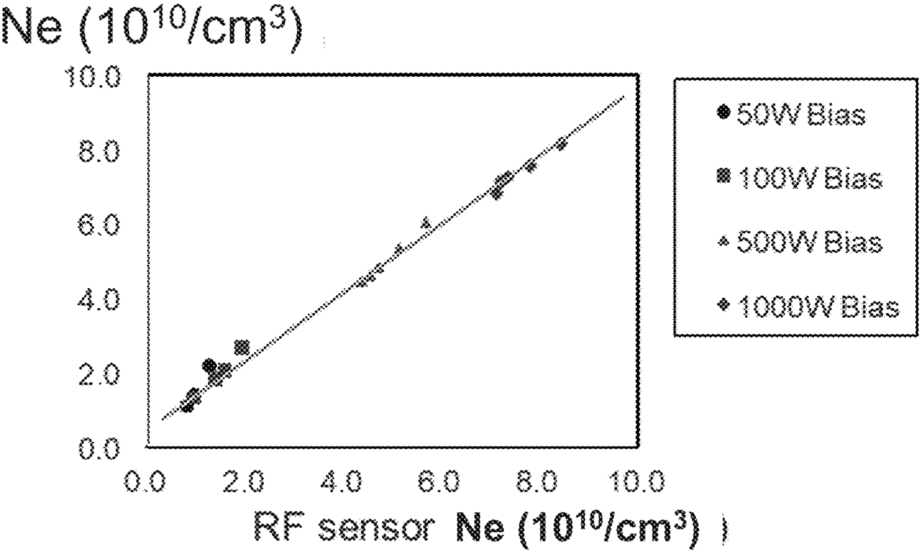
FIG. 3 shows radio frequency sensor calibration in accordance with one embodiment of the present disclosure.

FIG. 3 shows one example of radio frequency (RF) sensor calibration. Herein, an RF sensor is calibrated against electron density (Ne) measurement. The use of plasma diagnostic to pre-process RF sensor data can improve etch rate (ER) prediction accuracy. In this example, the RF sensor can include a voltage peak-to-peak (VPP) sensor. VPP can denote the amount of RF voltage present at a surface of a wafer from RF power applied to the electrodes above or below the wafer within the processing chamber. Accordingly, the RF sensor can be configured to measured voltage and current, particularly on-wafer voltage and on-wafer current at a respective wafer surface.

Referring back to FIG. 2A, the estimated plasma parameters 219 and the estimated wafer properties 223 can both be input into a profile simulator in block 231 to obtain a predicted profile 233 of the wafer 113. By contrast, arbitrarily defined etchant/ion/deposition fluxes are often used in traditional methods.

Figure 9A:
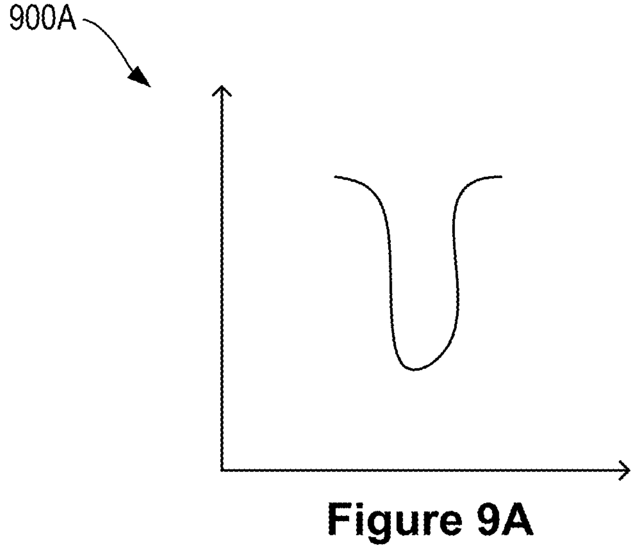
FIG. 9A shows an example of an initial wafer profile measured by wafer metrology.
Figure 9B:
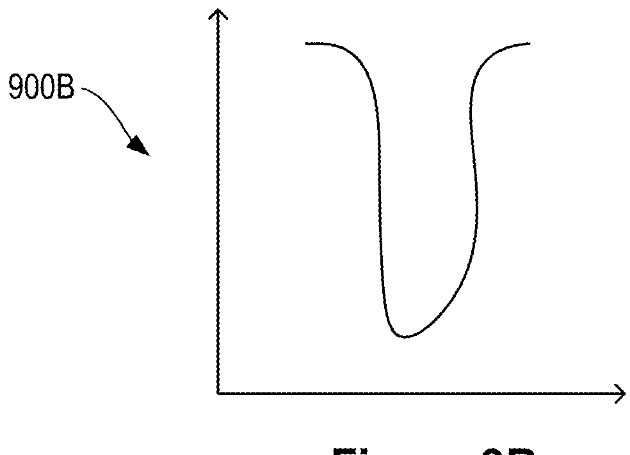
FIG. 9B shows an example of a post-etch wafer profile estimated by a profile simulator.

In FIG. 9A, one example of an initial cross-sectional profile 900A of the wafer 113 can be measured by wafer metrology such as ex-situ wafer metrology e.g. scanning electron microscopy (SEM) and transmission electron microscopy (TEM). The profile simulator can output a post-etch cross-sectional profile 900B in FIG. 9B as the predicted profile 233 of the wafer 113 based on the initial cross-sectional profile 900A and the estimated plasma parameters 219 (and optionally the estimated wafer properties 223 as well). In FIGS. 9A and 9B, a vertical axis can denote a depth while a horizontal axis can denote a relative horizontal position.

Referring back to FIG. 2A, a measured profile 241 of the wafer 113 can be obtained by ex-situ wafer metrology such as SEM and TEM after running the plasma recipe in block 209. Then in block 243, the predicted profile 233 and the measured profile 241 are compared with each other to calibrate the profile simulator. For example, the profile simulator may include one or more graphical models configured to generate a cross-sectional profile of the wafer. Accordingly, calibrating the profile simulator can be accomplished by adjusting at least one graphical model coefficient and/or at least one graphical model, based on a difference between the predicted profile 233 and the measured profile 241.

In the example of FIG. 2A, the in-situ wafer data are collected before, preferably immediately before, the plasma recipe is executed in block 209, in order to obtain an initial wafer temperature ($T_0$), which can be used to estimate a wafer temperature during a chamber run in block 209. In another example (not shown), the in-situ wafer data are collected after, preferably immediately after, the plasma recipe is executed in block 209, in order to obtain an endpoint wafer temperature ($T_{end}$), which can be used to estimate a wafer temperature during the chamber run in block 209. In yet another example (not shown), the in-situ wafer data are collected both before and after, preferably both immediately before and immediately after, the plasma recipe is executed in block 209, in order to obtain both $T_0$ and $T_{end}$. It should be understood that the in-situ wafer data can of course be collected one or more times during the chamber run in block 209, which can improve the accuracy of wafer temperature estimation. However, such measurements may possibly interfere with or affect the plasma environment of the chamber run in block 209.

In some embodiments, the controller 130 may optionally be coupled to various components of the process 200A to receive inputs from and provide outputs to the components. For example, the controller 130 can be configured to receive the estimated plasma parameters 219 from block 215 and/or the estimated wafer properties 223 from block 221. The controller 130 can also be configured to implement measurement in block 207 and/or block 211. Additionally, the controller 130 can be configured to run the profile simulator in block 231 and/or calibrate the profile simulator in block 243. The controller 130 may further be configured to implement DOE in block 201, receive the recipe parameters 203, and/or execute the plasma recipe in block 209. Of course, one or more functions of the controller 130 can also be manually accomplished.

Figure 2B:
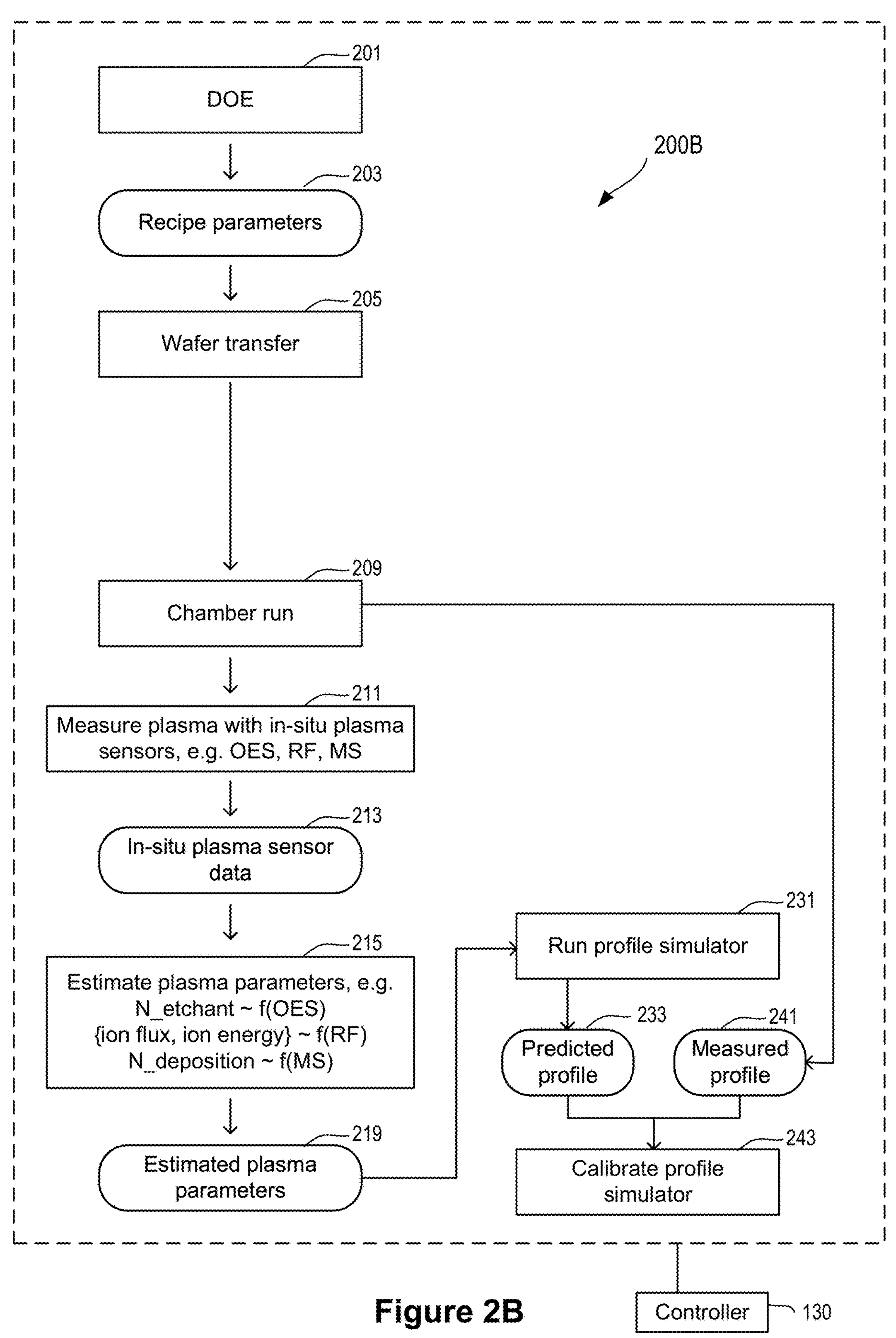
FIG. 2B shows a flow diagram of profile simulator calibration in accordance with another embodiment of the present disclosure.

FIG. 2B shows a flow diagram of a process 200B of profile simulator calibration in accordance with another embodiment of the present disclosure. The process 200B is similar to the process 200A. Identical numerals can denote identical or similar components unless specified otherwise.

In the example of FIG. 2B, block 207 and block 221 are not necessary. As a result, the estimated wafer properties 223 need not be obtained. In block 231, the estimated plasma parameters 219 are input into the profile simulator, without the estimated wafer properties 223.

Table 1 below shows a comparison of the process 200A, the process 200B and conventional approaches. As shown, conventional approaches utilize neither the in-situ wafer metrology sensors 117 nor the in-situ plasma sensors 119. Therefore, many variables or properties cannot be measured or estimated, including ion angle distribution (IAD), ion flux, ion energy, radical flux, precursor flux of various species, sticking coefficients (temperature, refractive indices of materials (n and k)), and the like. The process 200B utilizes the in-situ plasma sensors 119 and thus can enable the measurement and/or estimation of ion flux, ion energy, radical flux, precursor flux (some species) and the like. The process 200A utilizes both the in-situ wafer metrology sensors 117 and the in-situ plasma sensors 119 and thus can further enable the measurement and/or estimation of temperature. Additionally, IAD, some precursor fluxes and sticking coefficients (n and k) may be the variables that are calibrated.

TABLE 1

| Calibrating Unknown profile simulation input variables | | |
|---|---|---|
| | Unable to measure or estimate | Able to measure or estimate |
| The process 200A (With 117 and 119) | Ion angle distribution (IAD), sticking coefficients (refractive indices of materials (n and k)) | Ion flux, ion energy, radical flux, precursor flux (some species), temperature |
| The process 200B (With 119; without 117) | IAD, sticking coefficients (temperature, refractive indices of materials (n and k)) | Ion flux, ion energy, radical flux, precursor flux (some species) |
| Conventional approaches (Without 117 or 119) | IAD, ion flux, ion energy, radical flux, precursor flux (various species), sticking coefficients (temperature, refractive indices of materials (n and k)) | |

Figure 4:
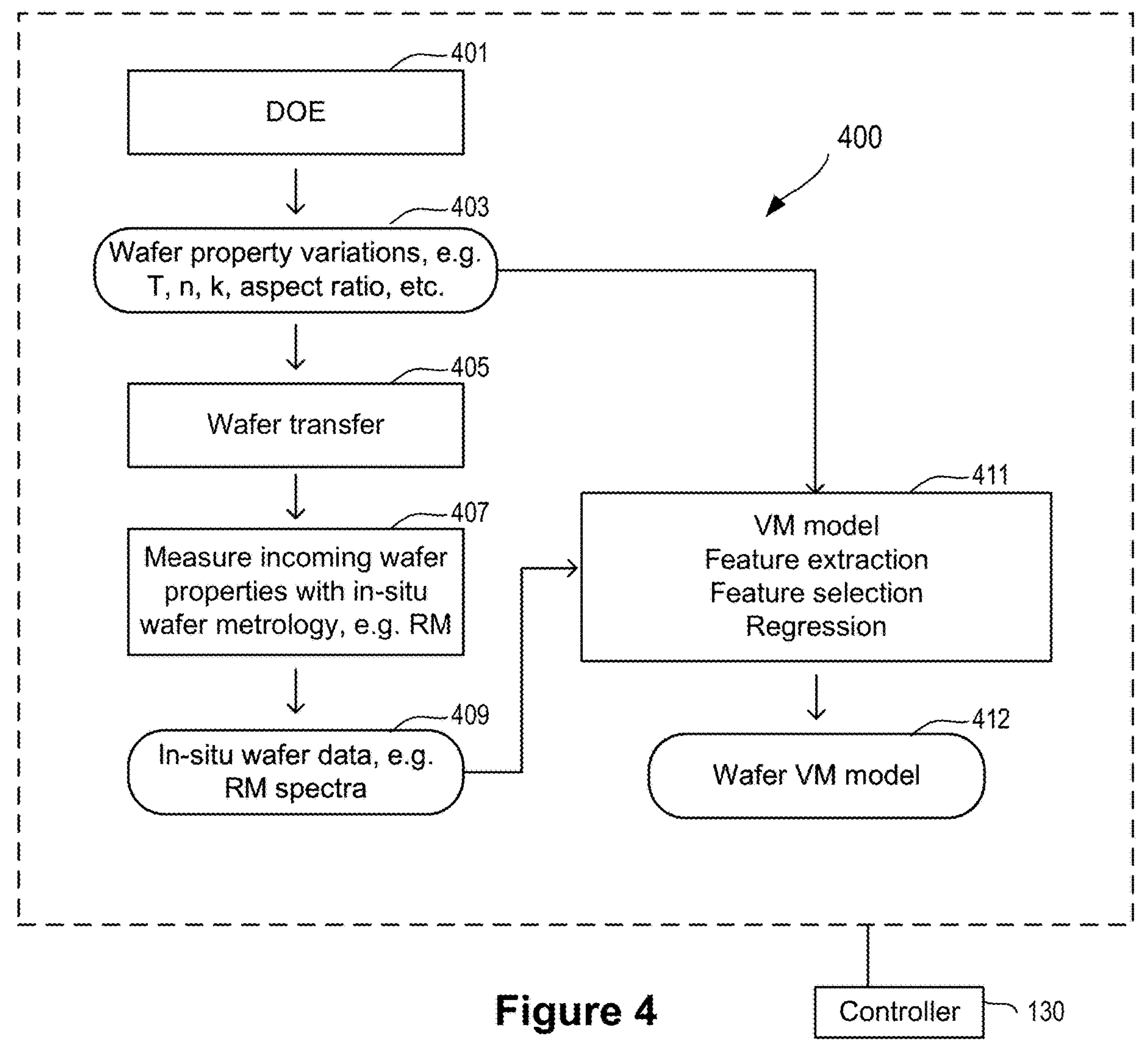
FIG. 4 shows a flow diagram of building a virtual metrology (VM) model in accordance with one embodiment of the present disclosure.

FIG. 4 shows a flow diagram of a process 400 of building a virtual metrology (VM) model, such as the wafer VM model used in block 221 in FIG. 2A, in accordance with one embodiment of the present disclosure. In block 401, design of experiment (DOE) is executed to select or obtain wafer property variations 403 such as wafer temperature, film refractive indices (n and k), an aspect ratio of a wafer pattern, electrostatic chuck (ESC) temperature, etc. In block 405, the wafer 113 is transferred to or loaded in the chamber 110. In block 407, incoming wafer properties can be measured with the in-situ wafer metrology sensors 117 such as a reflectometer, similar to block 207. As a result, in-situ wafer data 409, such as reflectometry spectra, can be obtained.

In block 411, the wafer property variations 403 and the in-situ wafer data 409 are used to build a VM model. The corresponding model building process can include feature extraction, feature selection, regression and the like. Consequently, a wafer VM model 412 is obtained.

In some embodiments, the controller 130 may optionally be coupled to various components of the process 400 to receive inputs from and provide outputs to the components, similar to the process 200A in FIG. 2A. The descriptions have been provided above and will be omitted herein for simplicity purposes.

Figure 5:
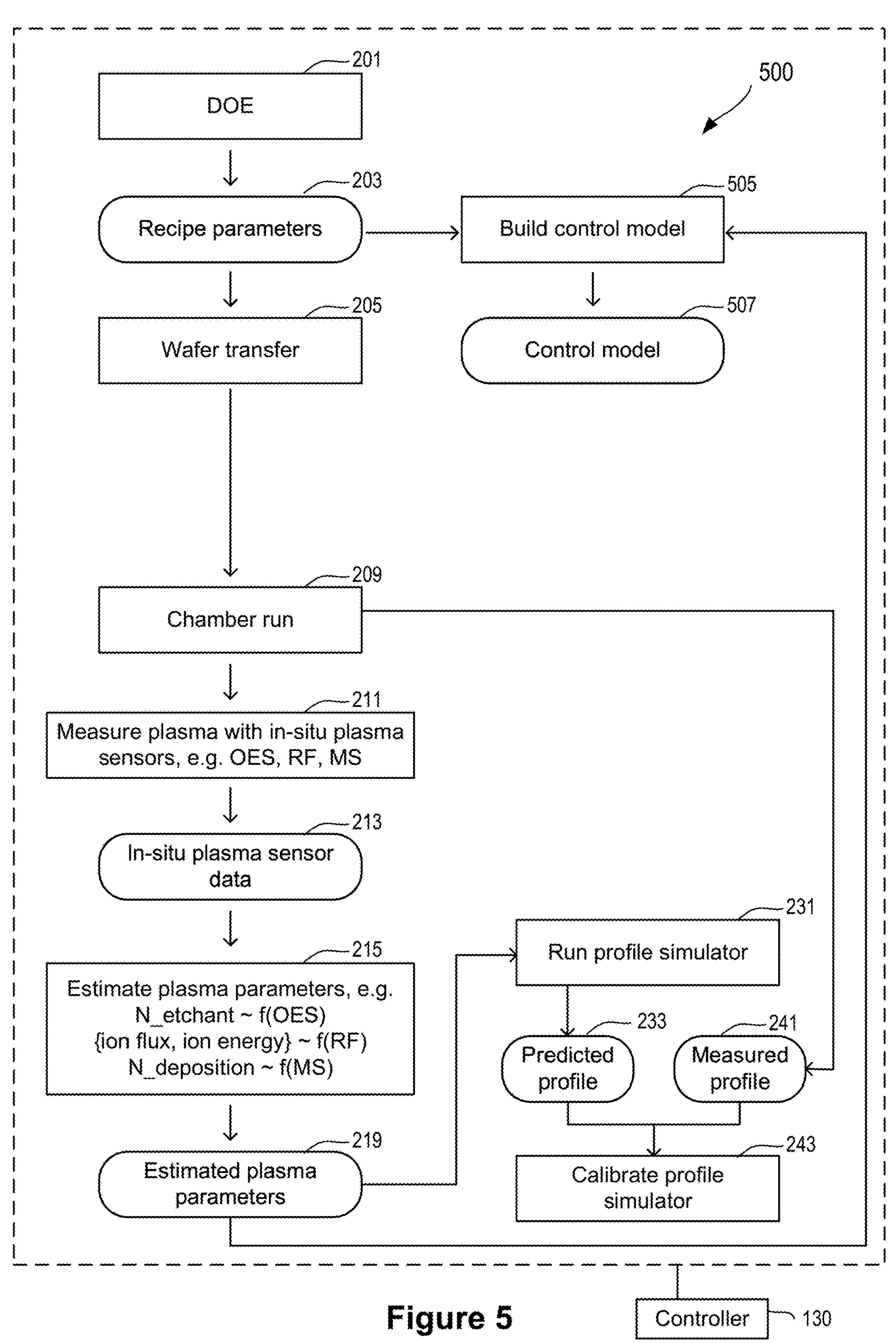
FIG. 5 shows a flow diagram of building a control model in accordance with one embodiment of the present disclosure.

FIG. 5 shows a flow diagram of a process 500 of building a control model in accordance with one embodiment of the present disclosure. The process 500 herein is similar to the process 200B in FIG. 2B. Identical numerals can denote identical or similar components unless specified otherwise. In block 505, a control model 507 can be built using the recipe parameters 203 and the estimated plasma parameters 219. The control model 507 can describe relationships between the recipe parameters 501 and plasma parameters (e.g. 219).

In some embodiments, the controller 130 may optionally be coupled to various components of the process 500 to receive inputs from and provide outputs to the components, similar to the process 200A in FIG. 2A. The descriptions have been provided above and will be omitted herein for simplicity purposes.

Figure 6:
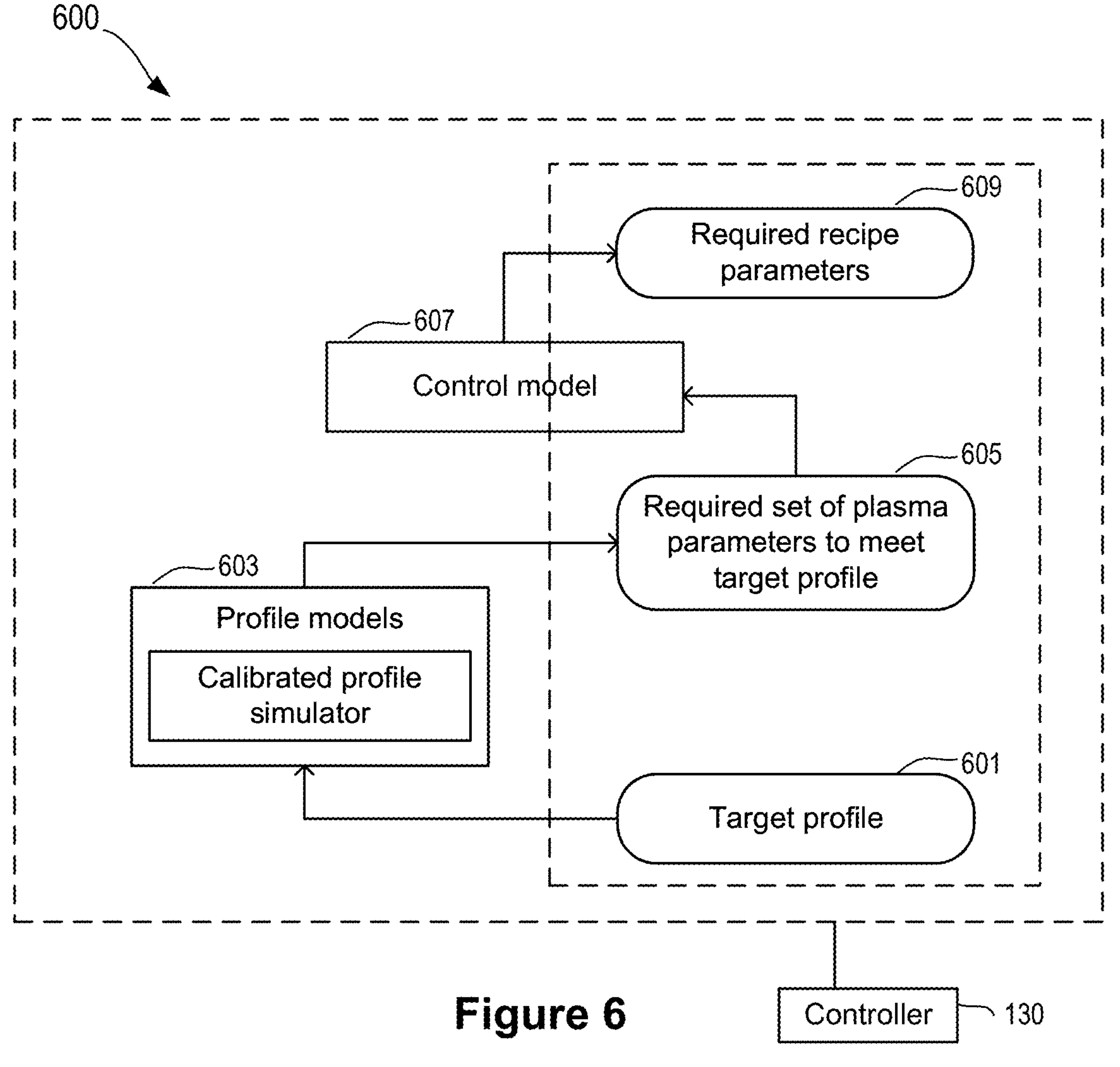
FIG. 6 shows a flow diagram of process optimization using a calibrated profile simulator in accordance with one embodiment of the present disclosure.

FIG. 6 shows a flow diagram of a process 600 for process optimization using a calibrated profile simulator in accordance with one embodiment of the present disclosure. As shown, a target profile 601 can be determined by a user and input into profile models 603 that contain a calibrated profile simulator such as one that is calibrated by the process 200A, 200B or the like. Then, a required set of plasma parameters 605 can be determined by the calibrated profile simulator and input into a control model (e.g. 507) in block 607 to output required recipe parameters 609.

In some embodiments, the controller 130 may optionally be coupled to various components of the process 600 to receive inputs from and provide outputs to the components, similar to the process 200A in FIG. 2A. The descriptions have been provided above and will be omitted herein for simplicity purposes.

Figure 7:
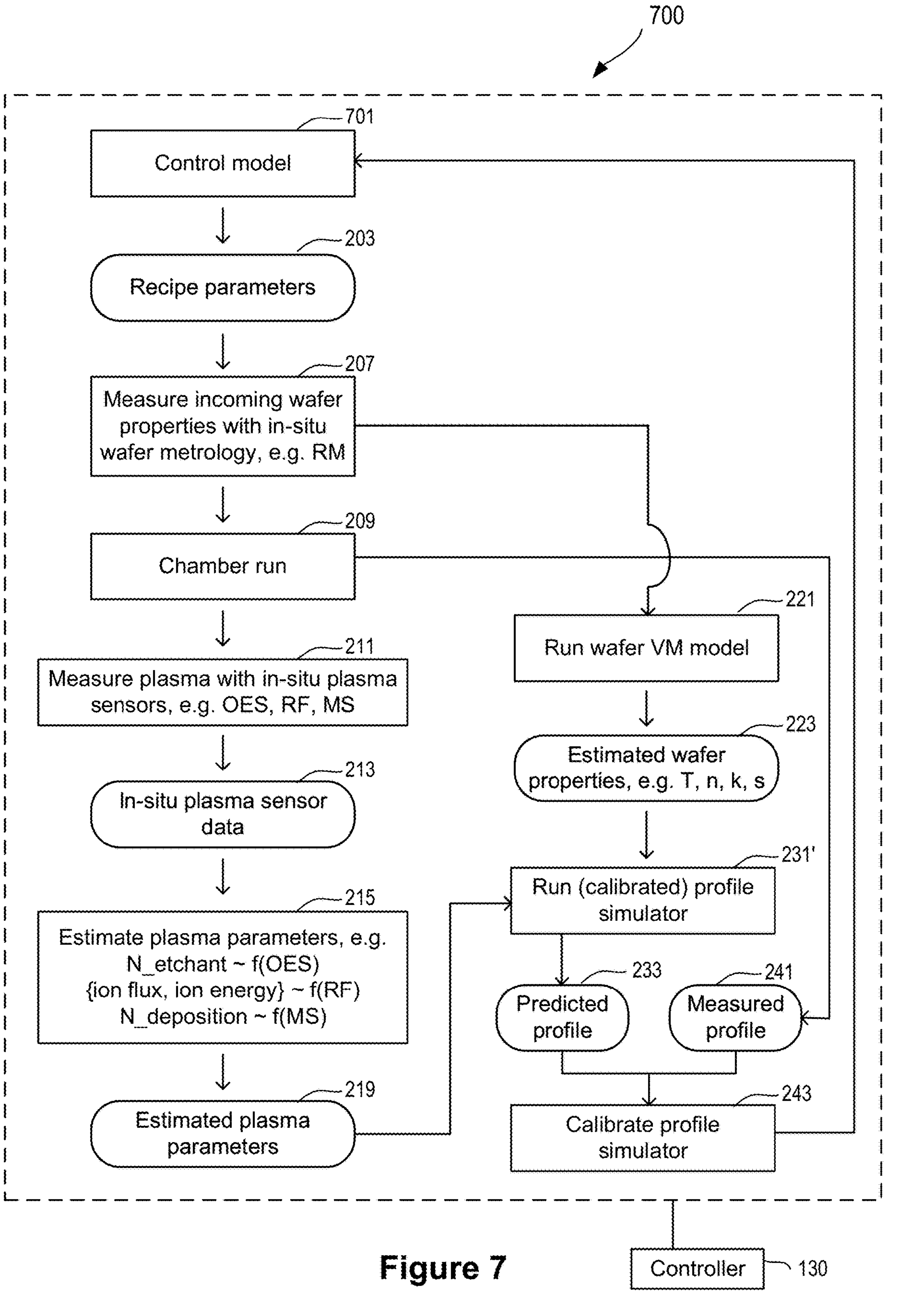
FIG. 7 shows a flow diagram of profile simulator correction in accordance with one embodiment of the present disclosure.

FIG. 7 shows a flow diagram of a process 700 of profile simulator correction in accordance with one embodiment of the present disclosure. The process 700 is similar to the process 200A. Identical numerals can denote identical or similar components unless specified otherwise.

In block 701, a control model (e.g. 507) is used to select or obtain the recipe parameters 203. After the profile simulator is calibrated in block 243, the corresponding calibrated profile simulator is verified or evaluated. For example, the process 700 may return to block 701 where the control model is used to adjust the recipe parameters 203 so as to adjust the plasma recipe to be executed in block 209. A new wafer may be transferred to or loaded in the chamber 110 before incoming wafer properties of the new wafer are measured with the in-situ wafer metrology sensors 117. In block 209, the (corresponding adjusted) plasma recipe is executed.

Similarly in block 231', a predicted profile of the new wafer can be obtained using the profile simulator calibrated. A measured profile of the new wafer can be obtained using the aforementioned ex-situ wafer metrology. The predicted profile of the new wafer is then compared with the measured profile of the new wafer to evaluate the corresponding calibrated profile simulator. When a difference between the predicted profile and the measured profile of the new wafer is within a threshold, the corresponding calibrated profile simulator is determined to be good. When the difference exceeds the threshold, the corresponding calibrated profile simulator needs to be re-calibrated. Accordingly, a user may choose to return to block 701 again to evaluate the corresponding re-calibrated profile simulator. Such calibration and evaluation processes can be repeated until the profile simulator has been calibrated to meet the aforementioned threshold requirement.

In some embodiments, the controller 130 may optionally be coupled to various components of the process 700 to receive inputs from and provide outputs to the components, similar to the process 200A in FIG. 2A. The descriptions have been provided above and will be omitted herein for simplicity purposes.

Figure 8:
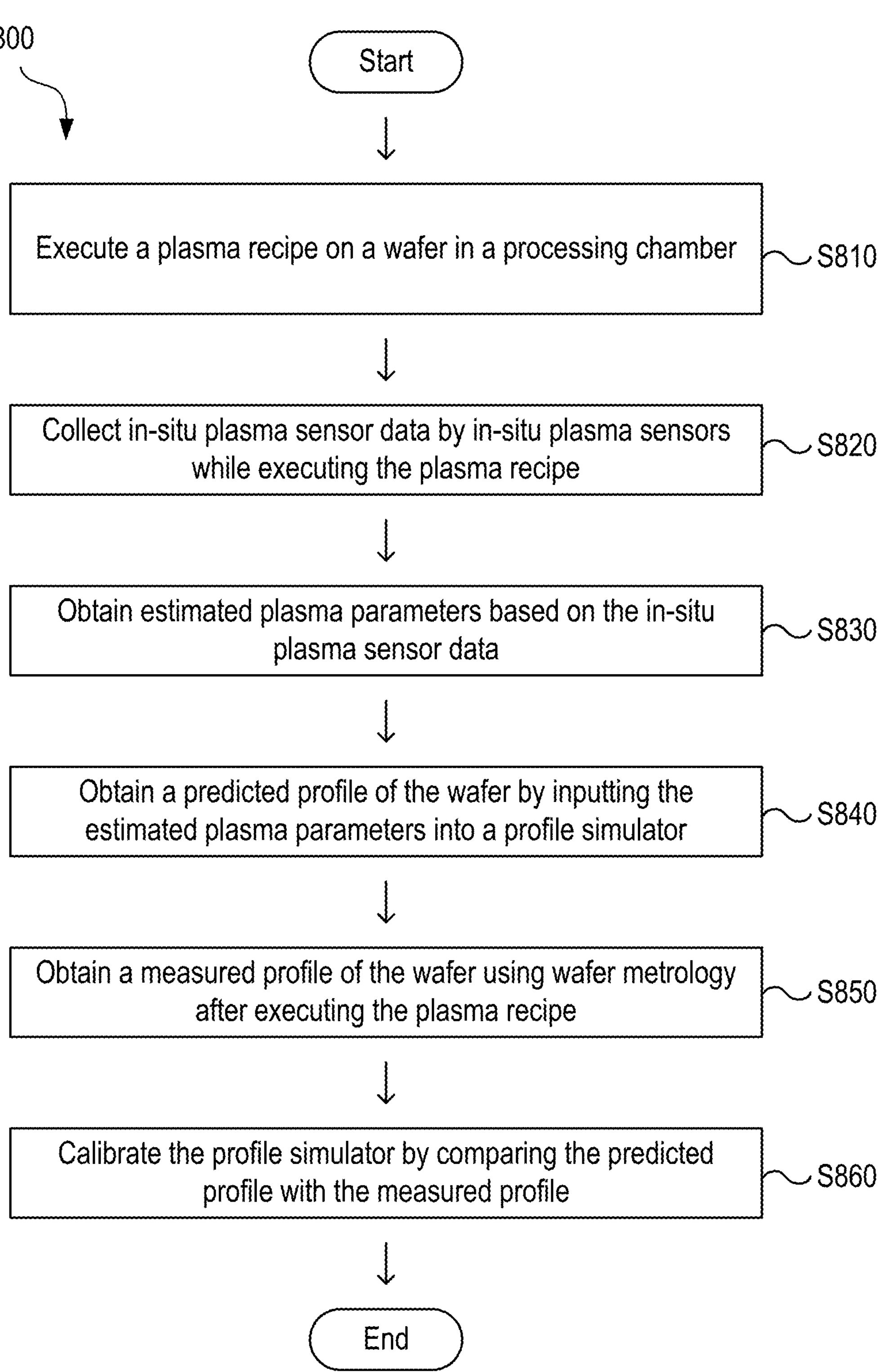
FIG. 8 shows a flow chart of profile simulator calibration, in accordance with some embodiments of the present disclosure.

FIG. 8 shows a flow chart of a process 800 of profile simulator calibration, in accordance with some embodiments of the present disclosure. At step S810, a plasma recipe is executed on a wafer in a processing chamber. At step S820, in-situ plasma sensor data are collected by in-situ plasma sensors while the plasma recipe is executed. At step S830, estimated plasma parameters are obtained based on the in-situ plasma sensor data. At step S840, a predicted profile of the wafer is obtained by inputting the estimated plasma parameters into a profile simulator. At step S850, a measured profile of the wafer is obtained using wafer metrology after executing the plasma recipe. At step S860, the profile simulator is calibrated by comparing the predicted profile with the measured profile.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of profile simulator calibration, the method comprising:

executing a plasma recipe on a wafer in a processing chamber;

collecting in-situ plasma sensor data by in-situ plasma sensors while executing the plasma recipe;

obtaining estimated plasma parameters based on the in-situ plasma sensor data;

obtaining a predicted profile of the wafer by inputting the estimated plasma parameters into a profile simulator;

obtaining a measured profile of the wafer using wafer metrology after executing the plasma recipe; and calibrating the profile simulator by comparing the predicted profile with the measured profile.

2. The method of claim 1, further comprising:

collecting in-situ wafer data by in-situ wafer metrology in the processing chamber; and obtaining estimated wafer properties by inputting the in-situ wafer data into a virtual metrology (VM) model.

3. The method of claim 2, further comprising:

inputting both the estimated plasma parameters and the estimated wafer properties into the profile simulator to obtain the predicted profile.

4. The method of claim 3, wherein:

the in-situ wafer metrology comprises an in-situ reflectometer, and the in-situ wafer data comprise reflectometry spectra.

5. The method of claim 4, wherein:

the estimated wafer properties comprise temperature and refractive indices of the wafer obtained from the VM model.

6. The method of claim 5, further comprising:

the estimated wafer properties further comprise a sticking coefficient based on the temperature and refractive indices of the wafer.

7. The method of claim 2, wherein:

the in-situ wafer data are collected immediately before, immediately after, or both immediately before and immediately after, executing the plasma recipe.

8. The method of claim 1, wherein:

the in-situ plasma sensors are not invasive to a plasma generated by executing the plasma recipe in the processing chamber.

9. The method of claim 8, wherein:

the in-situ plasma sensors do not directly measure plasma properties of the plasma.

10. The method of claim 1, wherein:

the in-situ plasma sensors comprise at least one sensor selected from the group consisting of an optical emission spectrometer (OES), a radio frequency (RF) sensor and a mass spectrometer (MS).

11. The method of claim 10, wherein:

the in-situ plasma sensors comprise an OES, the in-situ plasma sensor data comprise OES data, and obtaining the estimated plasma parameters comprises estimating an etchant density based on the OES data and actinometry.

12. The method of claim 10, wherein:

the in-situ plasma sensors comprise an RF sensor, the in-situ plasma sensor data comprise voltage and current (V-I) data, and obtaining the estimated plasma parameters comprises estimating an ion flux or ion energy based on the V-I data and a calibration against electron density measurement.

13. The method of claim 10, wherein:

the in-situ plasma sensors comprise an MS, the in-situ plasma sensor data comprise MS data, and obtaining the estimated plasma parameters comprises estimating a deposition rate based on the MS data.

14. The method of claim 1, wherein:

the profile simulator comprises one or more graphical models configured to generate a cross-sectional profile of the wafer.

15. The method of claim 14, wherein calibrating the profile simulator comprises:

adjusting at least one selected from the group consisting of a graphical model coefficient and a graphical model, based on a difference between the predicted profile and the measured profile.

16. The method of claim 15, further comprising:

adjusting the plasma recipe;

re-executing the plasma recipe;

obtaining a re-predicted profile using the profile simulator calibrated;

obtaining a re-measured profile using the wafer metrology; and comparing the re-predicted profile with the re-measured profile.

17. The method of claim 14, further comprising:

obtaining an initial profile of the wafer using the wafer metrology before executing the plasma recipe; and inputting the initial profile of the wafer and the estimated plasma parameters into the profile simulator to obtain the predicted profile.

18. The method of claim 1, wherein:

the wafer metrology comprises at least one selected from the group consisting of scanning electron microscopy (SEM) and transmission electron microscopy (TEM).

19. The method of claim 1, wherein:

the plasma recipe comprises a plasma etching recipe.

20. An apparatus, comprising a controller including a processor that is programmed to:

execute a plasma recipe on a wafer in a processing chamber;

collect in-situ plasma sensor data by in-situ plasma sensors while executing the plasma recipe;

obtain estimated plasma parameters based on the in-situ plasma sensor data;

obtain a predicted profile of the wafer by inputting the estimated plasma parameters into a profile simulator;

obtain a measured profile of the wafer using wafer metrology after executing the plasma recipe; and calibrate the profile simulator by comparing the predicted profile with the measured profile.

* * * * *